(12) United States Patent
Wasserbauer et al.

(10) Patent No.: US 6,882,673 B1
(45) Date of Patent: Apr. 19, 2005

(54) MIRROR STRUCTURE FOR REDUCING THE EFFECT OF FEEDBACK ON A VCSEL

(75) Inventors: John Wasserbauer, Erie, CO (US); Jeffrey W. Scott, Carpenteria, CA (US)

(73) Assignee: Optical Communication Products, Inc., Woodland Hills, CA (US)

( * ) Notice: Subject to any disclaimer, the term of this patent is extended or adjusted under 35 U.S.C. 154(b) by 74 days.

(21) Appl. No.: 10/051,510

(22) Filed: Jan. 15, 2002

Related U.S. Application Data
(60) Provisional application No. 60/262,261, filed on Jan. 15, 2001.

(51) Int. Cl.[7] .............................. H01S 5/00; H01S 3/08
(52) U.S. Cl. .......................................... 372/50; 372/96
(58) Field of Search ............................ 372/43–50, 96, 372/99

(56) References Cited

U.S. PATENT DOCUMENTS 5,574,738 A  *  11/1996  Morgan ....................... 372/28

* cited by examiner

*Primary Examiner*—Quyen Leung
(74) *Attorney, Agent, or Firm*—Barlow, Josephs & Holmes, Ltd.

(57) ABSTRACT

An exemplary embodiment of the present invention integrates an absorbing layer into the emitting mirror of a VCSEL to reduce the reflectivity of the emitting mirror as seen by the feedback optical wave. The absorbing layer may be made of a suitable semiconductor material, such as a GaAs layer in a laser emitting near 850 nm or highly doped p-layer, and may disposed epitaxially in a semiconductor or metamorphic mirror. Alternatively, a metal layer may be disposed in the dielectric portion of a hybrid mirror or all-dielectric mirror.

20 Claims, 16 Drawing Sheets

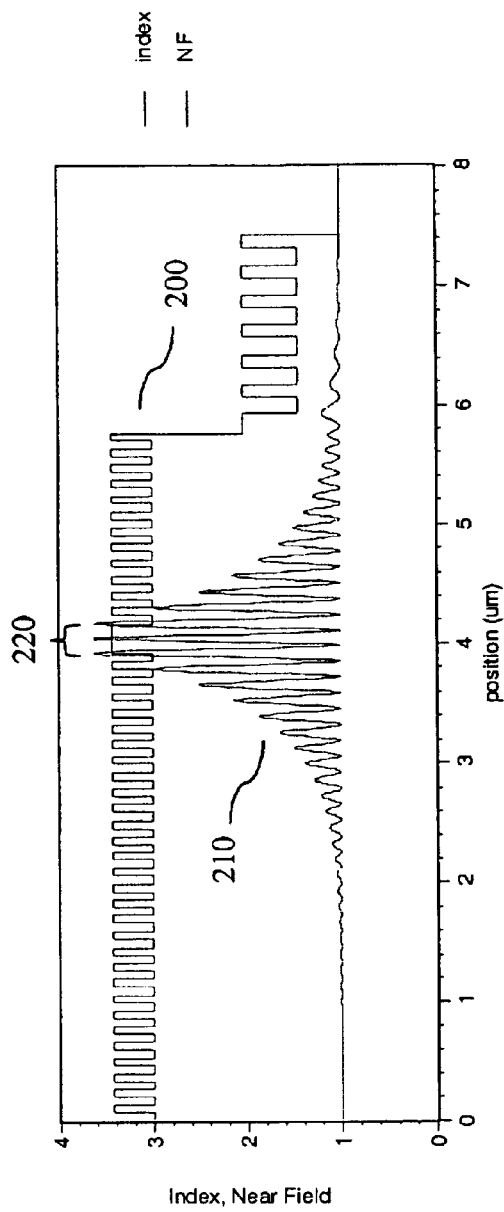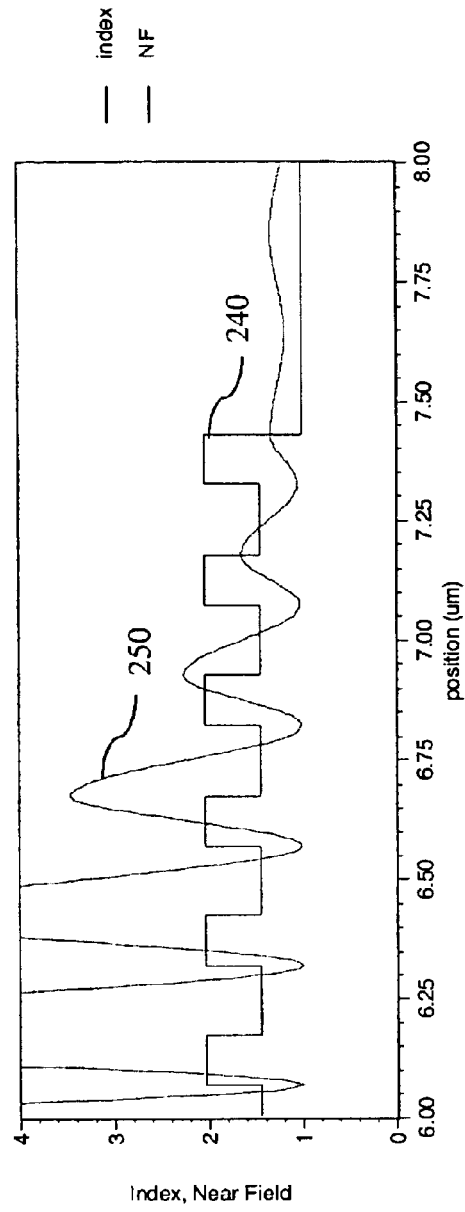
FIG. 5
FIG. 6

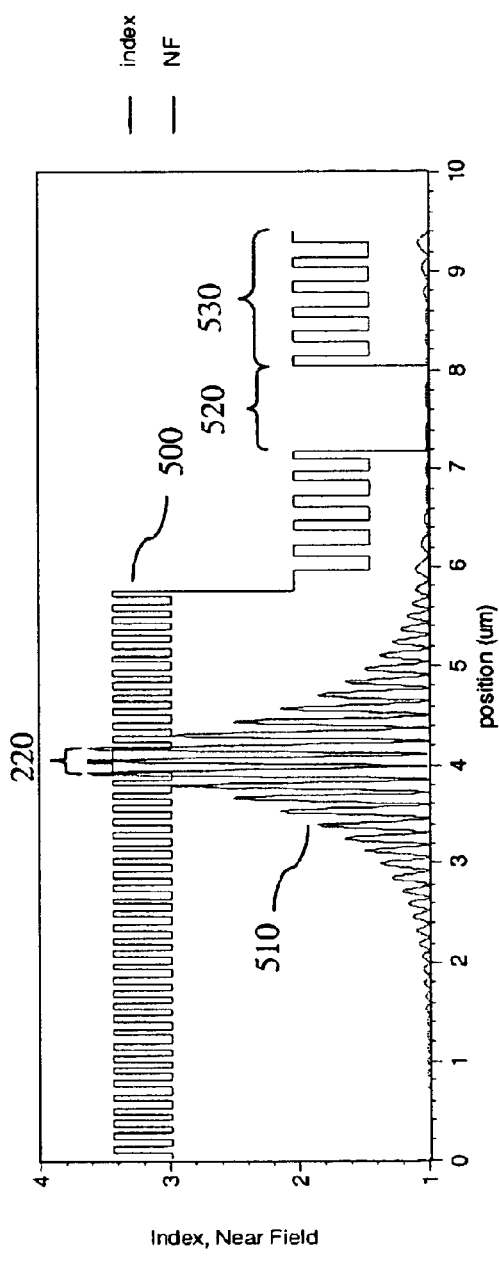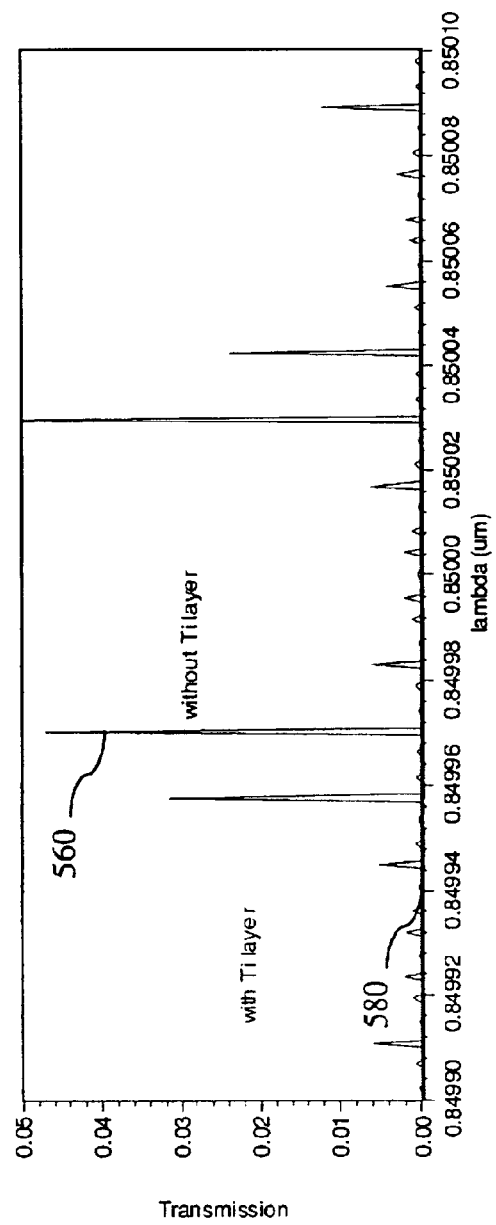
FIG. 18
FIG. 19

MIRROR STRUCTURE FOR REDUCING THE EFFECT OF FEEDBACK ON A VCSEL

CROSS REFERENCE TO RELATED APPLICATION

This application claims priority to U.S. Provisional Patent application Ser. No. 60/262,261, entitled "MIRROR STRUCTURE FOR REDUCING THE EFFECT OF FEEDBACK ON A VCSEL" filed on Jan. 15, 2001 the content of which is incorporated herein by reference.

FIELD OF THE INVENTION

The present invention is generally related to optical communication systems and is more particularly related to at optical transmitters.

BACKGROUND

In fiber optic systems and certain other applications, an optical subassembly couples the light from a semiconductor laser into an end face of an optical fiber. Reflections from anywhere within the optical sub-assembly, such as the fiber end face, optical lens element, beam splitter, polarizer or optical isolator, may provide feedback to the laser. Unfortunately, semiconductor lasers, including vertical cavity surface emitting lasers (VCSELs), can be very sensitive to optical feedback. Medium to strong feedback in the range of about −35 dBm to 0 dBm may give rise to relative intensity noise (RIN), power modulation, or other coupled cavity effects.

Conventionally these effects are addressed through careful design of the optical package in which the devices are housed. Current approaches include the use of angled fiber end facets, fiber anti-reflective (AR) coatings, lens AR coatings, defocusing along the optical axis, beam splitters, and optical isolators. However, the cost of adding or modifying external optical elements is typically higher than the cost of integrated components. Therefore, these approaches, if used only to address the problem of optical feedback, may increase the cost of the optical package.

Conventional device designs further exasperate the problem of optical feedback. For example, the transmission in a conventional mirror is roughly the same in each direction. The reflectivity, however, is typically asymmetric and often is higher looking from the air toward the cavity, than from cavity to air. Conventional mirrors may therefore strongly return reflections from one or more external components and may therefore create a high Q external cavity when the laser is integrated into an optical sub-assembly. When fluctuations in laser drive current or temperature occur, the external cavity acts as a Fabry-Perot etalon which modulates the output power. In addition, two high Q cavities in series can cause multiple longitudinal modes to appear, which can give rise to RIN.

Referring to FIG. 1, Applicant of the present invention previously integrated an absorptive layer 8 into the emitting mirror of a VCSEL 10 to reduce the reflectivity of the emitting mirror as seen by a feedback optical wave. The VCSEL 10 included a lower mirror 14 formed above a substrate 12, an optical cavity 16 formed above the lower mirror and an upper mirror formed 18 above the optical cavity. The upper mirror 18 of this device was a hybrid mirror, having a semiconductor portion 20 and a dielectric portion 22. The device further included a current confinement ion implant 24 as well as a current constriction 26 for mode control and defining individual devices on a wafer.

The dielectric portion 22 of the hybrid mirror comprised alternating one-quarter wavelength thick layers of a high index of refraction dielectric material and a low index of refraction dielectric material. In this approach an absorptive titanium layer 28 was formed at the low-to-high index transition closest to the emitting facet. In this embodiment the titanium layer 28 was processed to remove it from within the aperture formed by an upper ohmic contact 30 to reduce the absorption losses as seen from the cavity. However, this approach provides less absorption of the optical feedback as seen from the external cavity. In particular, the large number of longitudinal modes that appear in the transmission spectrum due to the external cavity is not reduced.

SUMMARY

In one aspect of the present invention a vertical cavity surface emitting laser includes an optical cavity adjacent a first mirror, an emitting mirror adjacent the optical cavity, a mode defining aperture for controlling transverse modes and an absorbing layer integrated within the emitting mirror, wherein the absorbing layer is laterally located within at least a portion of said mode defining aperture.

In another aspect of the present invention a vertical cavity surface emitting laser includes an optical cavity adjacent a first mirror, a semiconductor emitting mirror adjacent the optical cavity, and an absorbing layer integrated within the emitting mirror.

In a further aspect of the present invention a method for reducing external feedback in a vertical cavity surface emitting laser includes determining optimum thickness of at least one of a plurality of high index layers in a first emitting mirror of a first VCSEL in accordance with the air side reflectivity of the first VCSEL, determining the optimum thickness of an absorbing layer in a second emission mirror of a second VCSEL in accordance with the air side reflectivity of the second VCSEL using the optimum thickness of the high index layers, and determining optimum thickness of at least one of a plurality of low index of refraction layers in a third emission mirror of a third VCSEL in accordance with the air side reflectivity of the third VCSEL using the optimum thickness of the high index layers and the optimum thickness of the absorbing layer.

BRIEF DESCRIPTION OF THE DRAWINGS

These and other features, aspects, and advantages of the present invention will become better understood with regard to the following description, appended claims, and accompanying drawings where:

FIG. 5 graphically illustrates the index and standing wave profiles (to scale) of a VCSEL with hybrid mirror and no absorber;

FIG. 6 is an expanded view of the index and standing wave profiles (to scale) of the dielectric mirror portion of the VCSEL of FIG. 5;

FIG. 18 is a graphical illustration of a simulation of the index and standing wave profiles of a VCSEL with hybrid mirror, no absorber and a 1λ external cavity with a feedback DBR mirror in accordance with an exemplary embodiment of the present invention;

FIG. 19 is a graphical illustration of a simulation of the transmission spectra of an external cavity formed when the emitting mirror of the VCSEL structure of FIG. 18, without the internal VCSEL cavity and lower mirror, is coupled with a 6000λ air gap 520 and a 5½ pair reflector 530 to provide feedback in accordance with an exemplary embodiment of the present invention;

DETAILED DESCRIPTION

An exemplary embodiment of the present invention may integrate an absorbing layer into the emitting mirror of a VCSEL to reduce the reflectivity of the emitting mirror as seen by a feedback optical wave. The absorbing layer may be made of a suitable semiconductor material. For example, a narrow bandgap GaAs layer may be used as an absorbing layer in a laser emitting near 850 nm or a highly doped p-type semiconductor layer. The absorbing layer may be disposed epitaxially in a semiconductor or metamorphic mirror. Alternatively, a metal layer may be disposed in the dielectric portion of a hybrid mirror or an all-dielectric mirror.

In an exemplary embodiment of the present invention, the absorber layer, such as for example 200 Å of Ti, may be integrated over at least a portion of the mode defining aperture, directly in the path of the exit beam. In this embodiment, the absorbing layer not only reduces the Q of the external cavity, which reduces power modulation, but also reduces the number of external cavity-generated longitudinal modes, and may therefore also reduce RIN.

Conventionally, absorptive layers located in the optical path of the beam are generally avoided because it reduces the efficiency of the device. However, in an exemplary embodiment of the present invention the absorbing layer may be selectively located and tuned to substantially reduce absorption of the transmit optical beam. Therefore the described exemplary embodiment may substantially increase absorption as seen from the external cavity with a relatively small increase in absorption as seen from the VCSEL cavity. Furthermore, in the case of partial reflectors such as thin metal layers, the small increase in absorption may be accompanied by a reduction in the number of mirror pairs, which eases fabrication requirements.

One of skill in the art will appreciate that the present invention is not limited to particular material systems or emission wavelengths. Rather, the compound semiconductor layers of the described exemplary light-emitting devices may be formed from a variety of group III-V or II-VI compound semiconductors, such as, for example, GaAs/AlGaAs, InGaAs/AlGaAs or InP/InGaAsP or other direct bandgap semiconductor materials.

Figure 1:
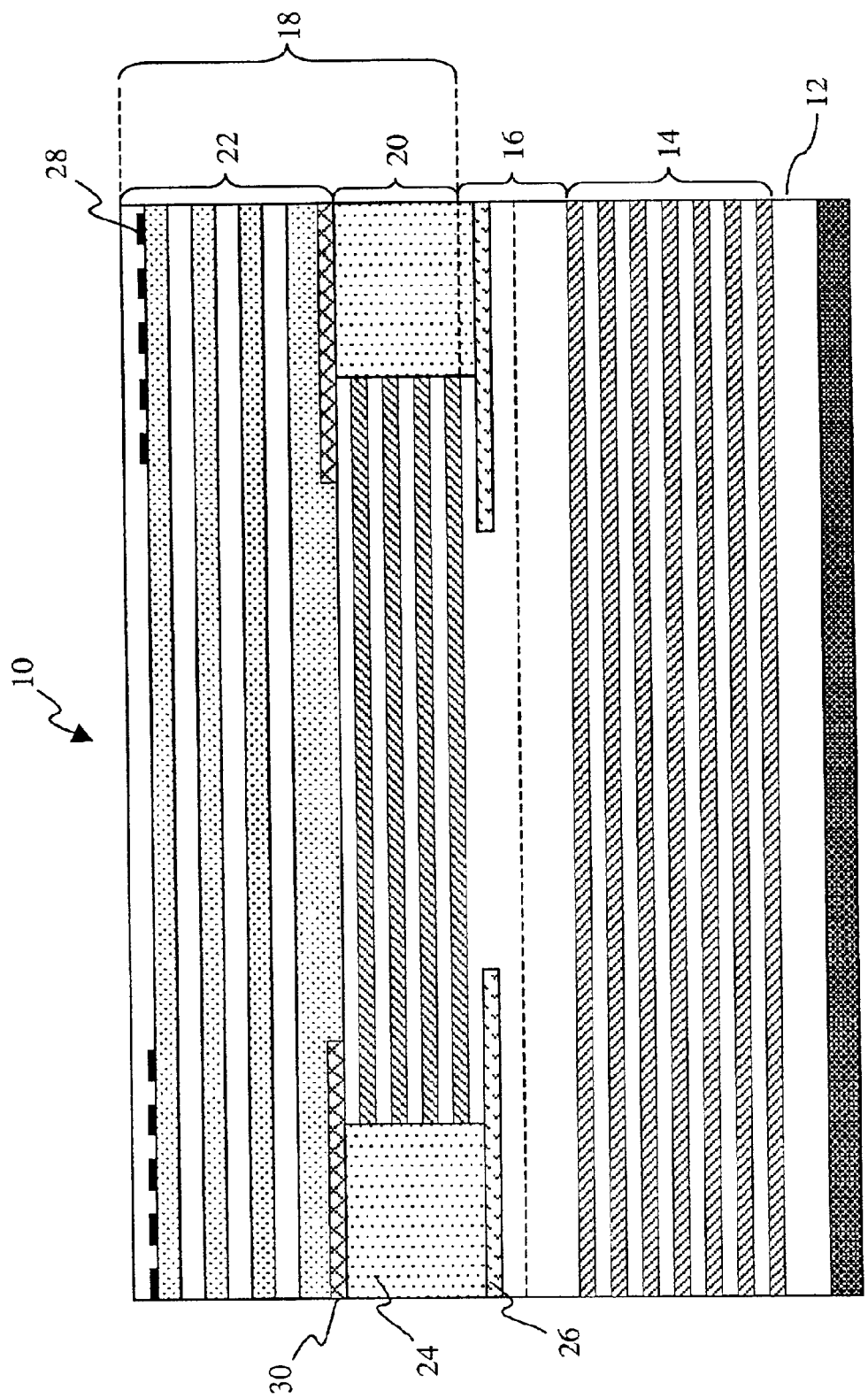
FIG. 1 is a cross sectional view of a prior art VCSEL developed by the Applicant of the present application having an absorbing layer integrated in the emission mirror outside the aperture formed by the upper ohmic contact.
Figure 2:
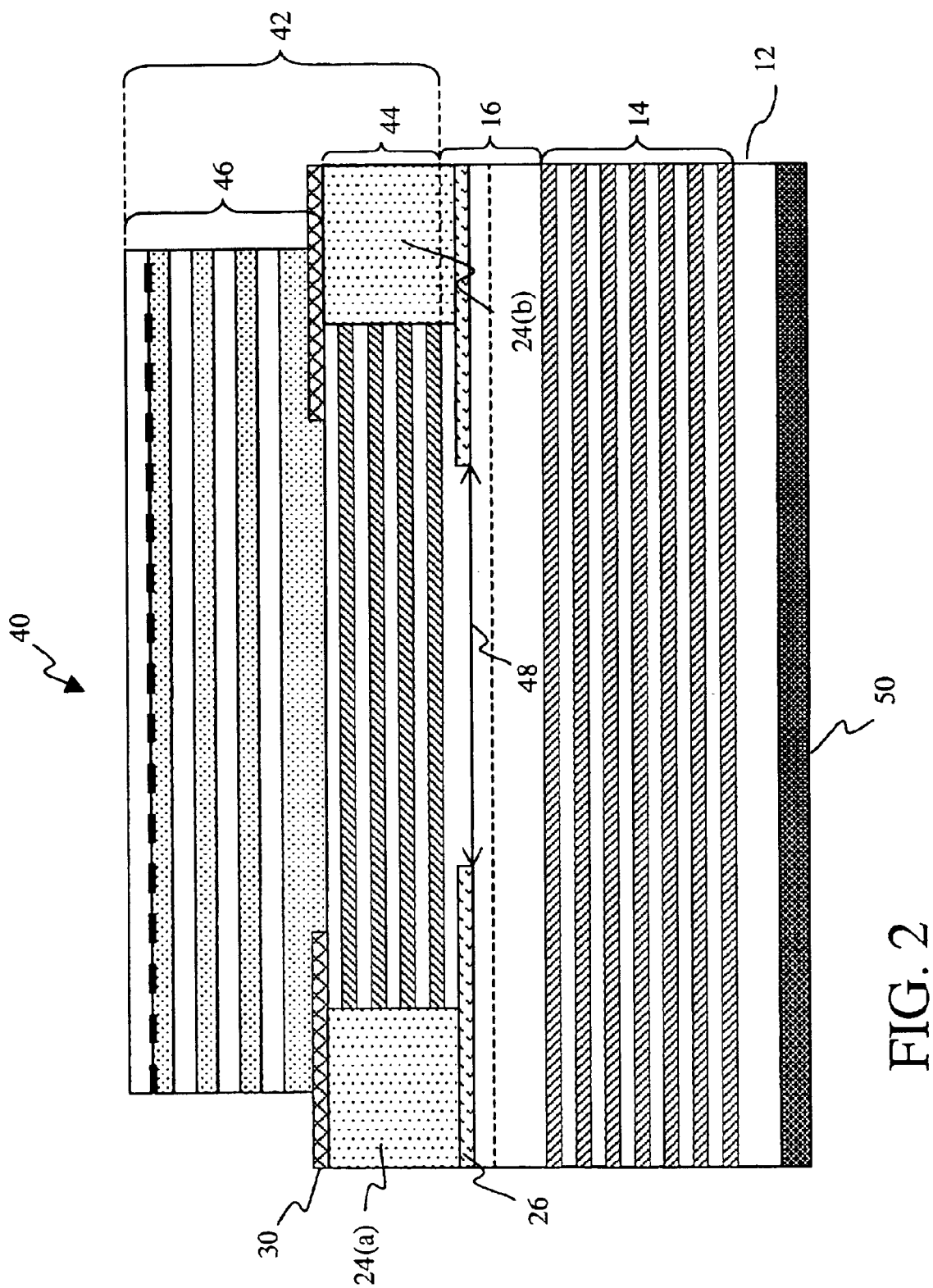
FIG. 2 is a cross sectional view of a VCSEL having an absorbing layer integrated within the mode-defining aperture in accordance with an exemplary embodiment of the present invention.

However the advantages of the present invention may be best understood in the context of an exemplary VCSEL 40 as illustrated in FIG. 2 where like reference numerals may be used to designate like features. An exemplary VCSEL may include a substrate 12, a lower mirror 14, an optical cavity 16 and an upper mirror 42. A conventional VCSEL portion of an exemplary embodiment of the present invention is disclosed in U.S. patent application Ser. No. 09/237,580, the contents of which are hereby incorporated by reference.

As is commonly known in the art, an exemplary substrate may comprise gallium arsenide (GaAs) or any other suitable material. The lower mirror 14 may comprise a multi-layered distributed Bragg reflector, (DBR) as is conventional in the art. An exemplary embodiment of the present invention may include a semiconductor upper mirror, a dielectric upper mirror or a hybrid upper mirror having semiconductor mirror layers 44 and dielectric mirror layers 46 as illustrated in FIG. 2.

An exemplary VCSEL may be formed into discrete lasers by a combination of current confinement and ohmic contacts. Current constriction may be achieved by implanting ions at multiple energies as is known in the art. Implantation regions 24(a) and 24(b) convert the semiconductor mirror layers 44 of the hybrid mirror to a high resistivity. The encircling high resistance region forms a funnel to provide current confinement as is known in the art. Other techniques for current constriction, such as selective AlAs oxidation, are also applicable.

The upper ohmic contact 30 is disposed above the optical cavity and in an exemplary embodiment may be formed adjacent the upper semiconductor mirror layers 42. The top ohmic contact 30 creates an ohmic aperture inside the aperture formed by the ion implant regions 24(a) and 24(b), to provide a ring contact. In the described exemplary embodiment the top ohmic contact 30 may be a p-type ohmic contact and may be, for example, gold with 2% beryllium added or a layered structure of titanium/platinum/gold, preferably deposited by electron beam evaporation.

In accordance with an exemplary embodiment, the upper ohmic contact 30 may also function as a mode-defining aperture restricting emission to a single transverse mode. One of skill in the art will appreciate however that a current constriction in the form of an ion implant or oxide aperture may also be utilized as a mode-defining aperture to provide single or multi-mode emission.

The bottom of the substrate may include a contact metalization, forming a lower ohmic contact 50. In one embodiment the lower ohmic contact may be an n-type ohmic contact and may be, for example, eutectic gold germanium deposited by electron beam evaporation or sputtering.

In the described exemplary embodiment, current flows from the upper ohmic contact 30 down through the current funnel, into the optical cavity where it recombines with opposite conductivity type carriers flowing up from the lower ohmic contact. The recombination in the optical cavity is a composite of spontaneous and stimulated emission, the stimulated emission exits the device out the top surface via the aperture in the upper ohmic contact.

One of skill in the art will appreciate that there are a plurality of suitable VCSEL structures which may be used to practice the present invention. Therefore the disclosed VCSEL structure is by way of example only and not by way of limitation.

Figure 3:
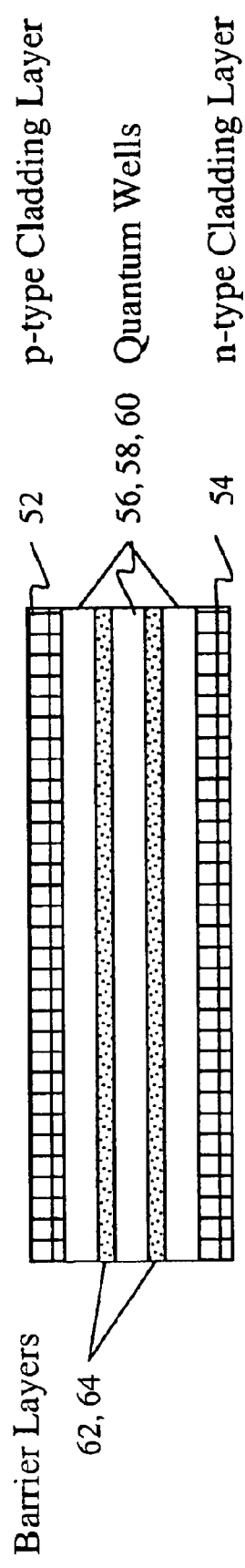
FIG. 3 is a cross sectional view of an exemplary multi-quantum well optical cavity.

Referring to FIG. 3, the optical cavity 16 in accordance with an exemplary embodiment of the present invention may include an active region surrounded by first and second cladding regions 52 and 54. In the described exemplary embodiment the first and second cladding regions 52 and 54 may comprise AlGaAs. The active region may comprise a plurality of quantum wells 56, 58, and 60, with barrier layers 62 and 64 there between. In the described exemplary embodiment the quantum wells 56, 58, and 60 may comprise GaAs and the adjacent barrier layers 62 and 64 may comprise $Al_xGa_{1-x}As$.

However, as is generally understood in the art, the materials forming the quantum wells and surrounding barrier layers may be varied depending on the design. Therefore, the disclosed optical cavity is by way of example and not by way of limitation.

Referring back to FIG. 2, in an exemplary embodiment, the lower mirror 14 and the semiconductor mirror layers 44 of the hybrid upper mirror may comprise alternating layers of aluminum gallium arsenide (AlGaAs) and aluminum arsenide (AlAs), with varying concentrations of aluminum. In an exemplary embodiment the upper and lower semiconductor mirror layers may be doped of opposite conductivity types. The optical thickness of each mirror layer is typically designed to be a quarter wavelength of the emitted light of the laser where the optical thickness is given by the product of the physical thickness and the index of refraction.

The dielectric mirror layers 46 of the hybrid mirror may comprise alternating one-quarter wavelength layers of silicon nitride and silicon dioxide or other suitable dielectric materials. The alternating layers of the dielectric mirror 46 may be patterned either by etching or liftoff processes known to those skilled in the art.

In the described exemplary embodiment an absorber layer 80 may be integrated into the dielectric layers of the hybrid upper or emitting mirror. The described exemplary absorbing layer extends across the entire ohmic aperture to provide maximum reflectivity as measured from the cavity side of the upper mirror and maximum absorption as measured from the air side of the upper mirror. However, the lateral extent of the absorbing layer may be limited to extend across only a portion of the ohmic aperture.

Figure 4:
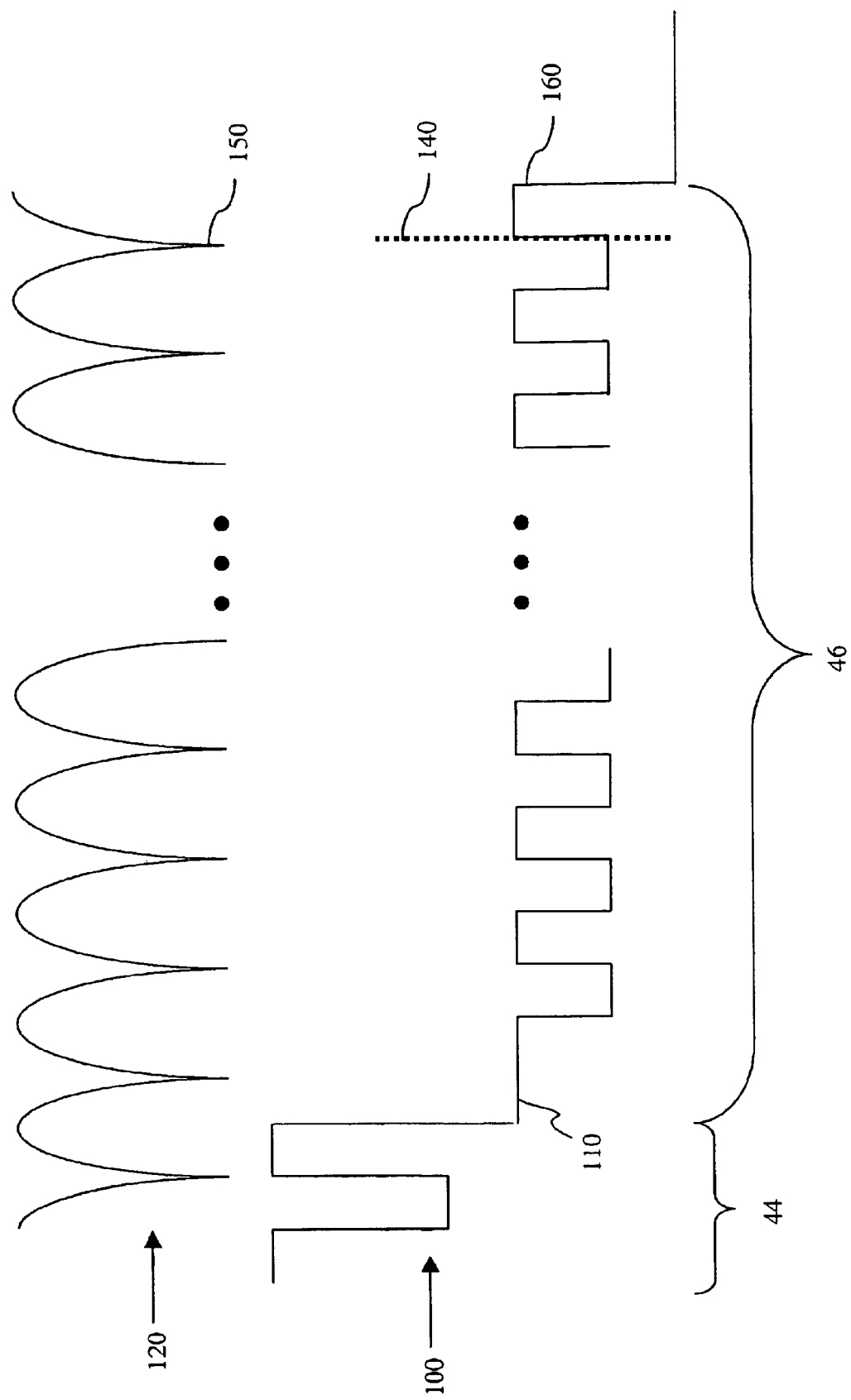
FIG. 4 graphically illustrates the index and standing wave profiles (not to scale) of a hybrid mirror structure having an absorbing layer integrated at a null in the standing wave intensity pattern in accordance with an exemplary embodiment of the present invention.

FIG. 4 graphically illustrates the index of refraction of the upper mirror overlayed with the optical standing wave intensity as a functional of vertical position within the device. Typically, the indexes of refraction of the semiconductor layers 44 are greater than the indexes of refraction of the dielectric layers 46, as illustrated by the index profile 100.

In the described exemplary embodiment a dielectric spacer layer 110 may be integrated between the semiconductor mirror layers 44 and the dielectric mirror layers 46 to maintain the correct phase between the two portions of the mirror. The optical thickness of the dielectric spacer layer may be chosen such that the maxima of the standing wave pattern 120, in both the semiconductor and dielectric portions of the mirror, appear at the high-to-low index transitions as seen from the optical cavity. This also ensures that the nulls in the standing wave pattern are located at the low-to-high index transitions as seen from the cavity.

In the described exemplary embodiment the absorbing layer 80 may be integrated at the standing wave null 150 nearest the emitting facet of the mirror 160. The axial standing wave intensity corresponds to the intensity of the light in the VCSEL relative to the vertical position within the device. Hence, the standing wave maxima are where the light is most intense, and the standing wave minima are where the light is least intense. Therefore, optical loss and optical scattering may be reduced by placing absorptive materials and or scattering sources at or near an axial standing-wave null.

If the absorbing layer is formed from Ti or other reflective material, the total reflectivity of the mirror as seen from the cavity will increase. Advantageously, this allows the number of dielectric mirror pairs to be reduced, easing processing requirements and reducing the total strain due to the dielectric layers.

FIG. 5 graphically illustrates the simulated index profile 200 and standing wave (near field) pattern 210 of a VCSEL with a hybrid upper mirror and no absorber layer. In the illustrated embodiment the VCSEL has been designed to emit at a nominal wavelength of 850 nm. The near field standing wave is most intense at or near the optical cavity 220 and decays exponentially as a function of the distance from the optical cavity. FIG. 6 is an expanded view of the index profile and near field standing wave intensity pattern 250 within the hybrid upper mirror of FIG. 5 near the emitting facet 240.

Figure 7:
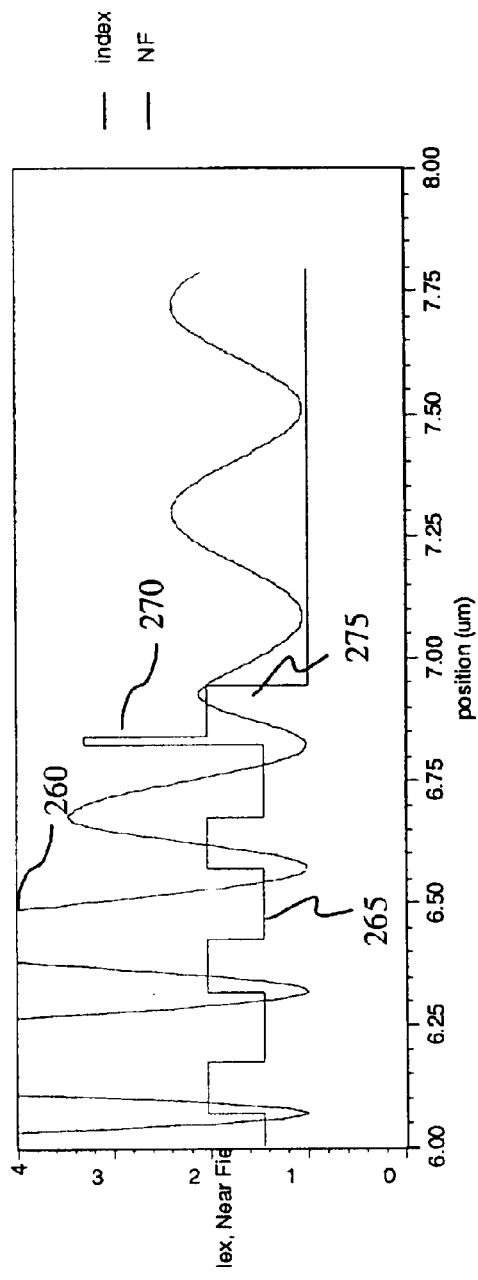
FIG. 7 is an expanded view of the index and standing wave profiles (to scale) of the dielectric mirror portion of a VCSEL with a Ti absorber in accordance with an exemplary embodiment of the present invention.

FIG. 7 graphically illustrates the simulated index profile 265 and near field standing wave pattern 260 for a VCSEL structure with a 20 nm Ti absorbing layer 270 integrated into the dielectric portion of the upper mirror. In the described exemplary embodiment the absorbing layer is integrated at or near the null in the near field standing wave intensity pattern that is nearest the emitting facet 275. In this embodiment the number of mirror pairs in the dielectric portion of the hybrid upper mirror has been reduced by two to keep the overall reflectivity approximately constant.

The performance of the upper mirror of the described exemplary VCSEL structure may be further characterized as a function of the calculated reflectivity, R, transmission, T, and absorption, A, viewed from the cavity and the air as summarized in Table 1. Without an absorbing layer the operating performance of a hybrid upper or emitting mirror is substantially symmetric, having approximately equal reflection, transmission and absorption as viewed from the internal cavity or external, air side of the mirror.

The reflection and transmission as viewed from the cavity remains substantially equal for the described exemplary VCSEL structure having an absorbing layer integrated into the dielectric portion of the upper mirror and two fewer dielectric mirror pairs as illustrated in FIG. 7. However, the integration of the absorbing layer increases the absorption of the output as viewed from the cavity from 0% to approximately 0.1405%. The magnitude of the increase is relatively minimal because the absorbing layer is integrated at or near a null in the standing wave intensity pattern at a maximum distance from the internal VCSEL cavity. Therefore, this relatively small increase in absorption may cause only a relatively minor reduction in the efficiency of the laser.

Figure 8:
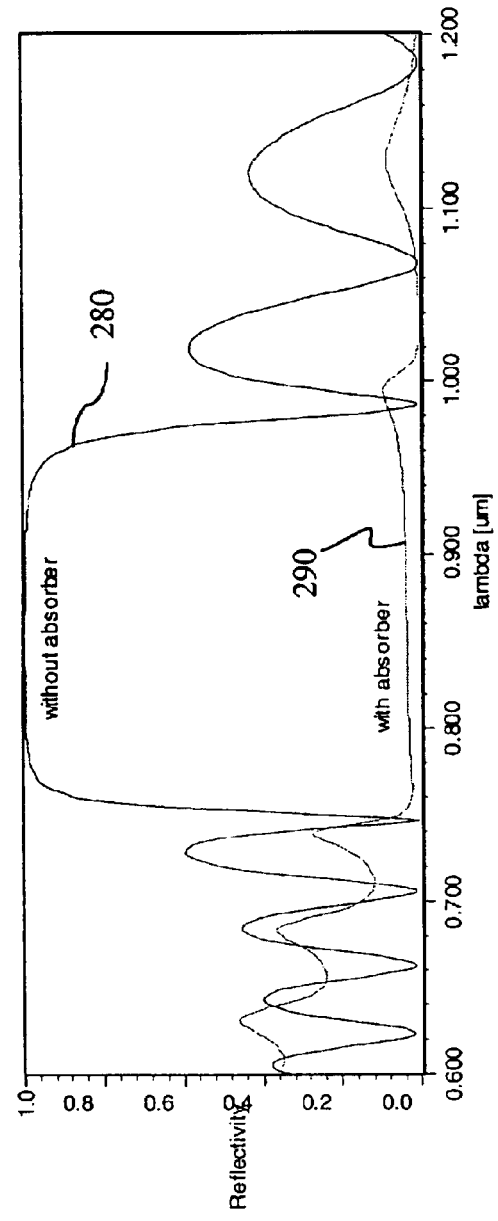
FIG. 8 graphically illustrates the air side reflectivity spectra of a hybrid mirror with and without a Ti absorber.

The reflectivity of the described exemplary upper mirror with an absorbing layer greatly decreases when viewed from the air toward the internal VCSEL cavity. Referring again to Table 1, in the described exemplary embodiment the reflectivity decreases from 99.8668% to 3.5519%, due to an increase in absorption from 0% to 96.3045%. In effect, the described exemplary mirror with an absorbing layer performs like a one-way mirror. FIG. 8 graphically illustrates the air side reflectivity spectrum of the upper mirror with an absorbing Ti layer 280 and without an absorbing Ti layer 290.

TABLE 1

| Parameter | Without Ti | With Ti |
| --- | --- | --- |
| $R_{cavity}$ | 99.8668% | 99.7159% |
| $T_{cavity}$ | 0.1332% | 0.1436% |
| $A_{cavity}$ | 0% | 0.1405% |
| $R_{air}$ | 99.8668% | 3.5519% |
| $T_{air}$ | 0.1332% | 0.1436% |
| $A_{air}$ | 0% | 96.3045% |

Figure 9:
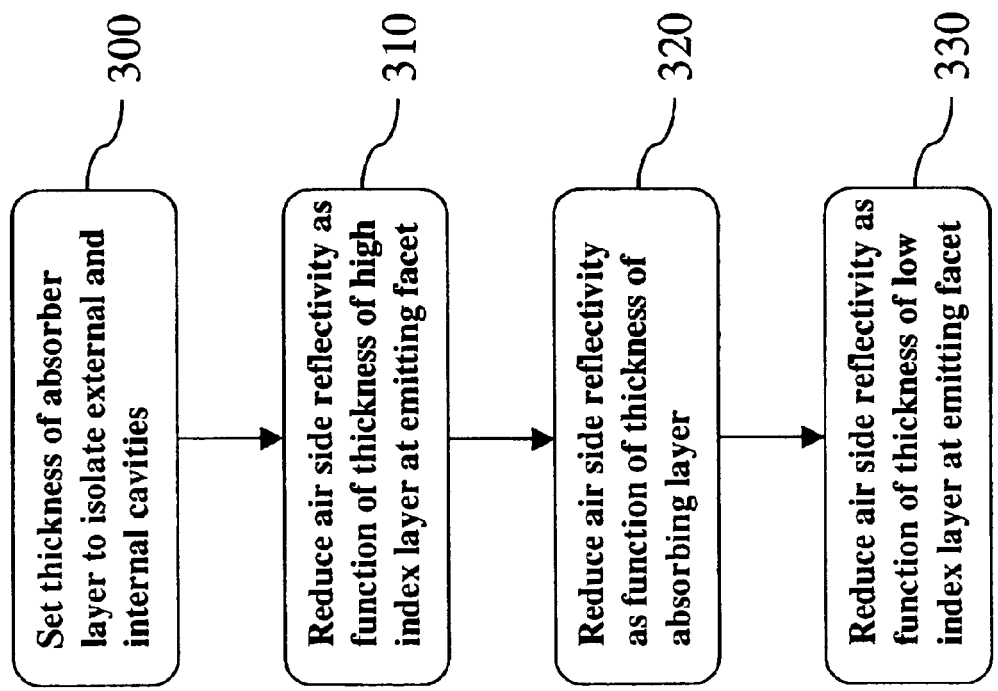
FIG. 9 is a flow chart illustrating an exemplary process for optimizing the design of an emission mirror having an absorbing layer in accordance with an exemplary embodiment.

In accordance with an exemplary embodiment the integration of an absorbing layer into the emitting mirror of a VCSEL structure may be further optimized to provide further reductions in the external reflectivity of a VCSEL. FIG. 9 is flow chart illustrating an exemplary process for optimizing the design of an emitting mirror having an integrated absorbing layer. In accordance with an exemplary embodiment an optimum emission mirror may be developed for a particular application using the transfer matrix formalism to optimize the thickness of the absorbing layer, as well as the optical thickness of the mirror layers that form the last mirror pair.

In accordance with an exemplary process a user may first define the constitutive parameters of the emitting mirror and the absorbing layer 300. In accordance with an exemplary embodiment of the present invention, it is the reflectivity as seen from the external cavity that is reduced or minimized. In an exemplary embodiment a Ti absorbing layer with a refractive index of approximately 3.3 and an absorption constant of about 5.7 may be integrated into a dielectric upper mirror formed from a plurality of alternating layers of $SiO_2$ and $SiN_x$ for emission at a nominal wavelength of 850 nm. In the described exemplary embodiment the Ti absorbing layer is integrated at the low-to-high index transition (the $SiO_2/SiN_x$ interface) in the last mirror pair. The variables in the optimization procedure are therefore the thickness of the Ti layer and the optical thickness of the $SiN_x$ and $SiO_2$ layers that form the last mirror pair.

Figure 10:
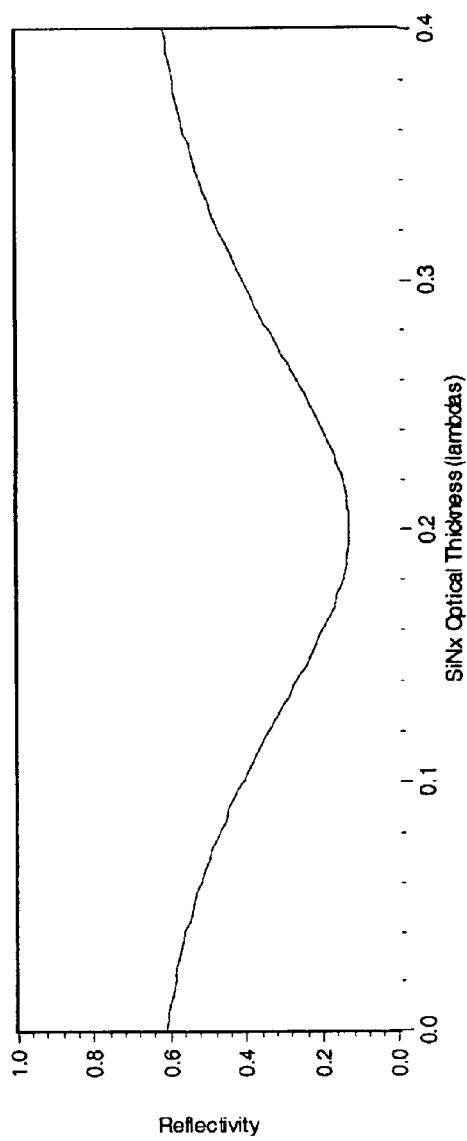
FIG. 10 is an optimization curve for the thickness of the $SiN_x$ layer deposited on top of a 100 nm Ti absorber layer in accordance with an exemplary embodiment of the present invention.

In accordance with the described exemplary design process a user may simplify the design process by selecting starting layer thicknesses that allow for the independent optimization of each of the layers that form the final mirror pair. For example, if the Ti absorbing layer is, sufficiently thick, say 100 nm, all light incident from the air side will be absorbed or reflected. This isolates the external cavity from the rest of the emitting mirror. Thus, an exemplary design process may first substantially reduce or minimize the air side reflectivity as a function of the thickness of the high index of refraction $SiN_x$ layer 310 with an Ti absorbing layer on the order of about 100 nm. FIG. 10 graphically illustrates the air side reflectivity as a function of the optical thickness of the high index $SiN_x$ layer. In the described exemplary embodiment, a minimum occurs in the air side reflectivity when the optical thickness of the $SiN_x$ layer is approximately $0.200\lambda$.

Figure 11:
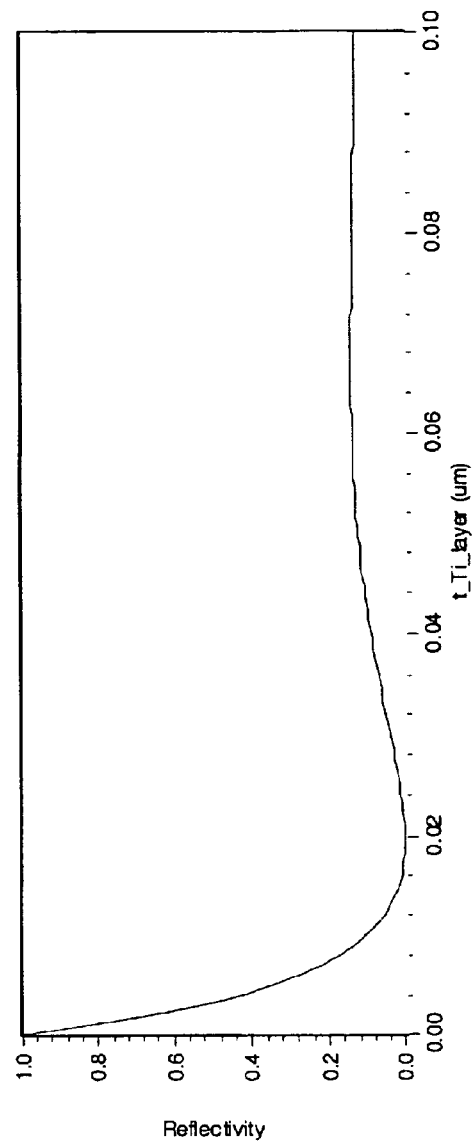
FIG. 11 is an optimization curve for the thickness of the Ti absorber layer with a SiNx layer thickness of 0.200λ in accordance with an exemplary embodiment of the present invention.

In accordance with an exemplary design process the air side reflectivity of the emission mirror may now be minimized or substantially reduced as a function of the thickness of the Ti absorbing layer using the previously optimized $SiN_x$ high index layer FIG. 11 graphically illustrates the air side reflectivity as a function of the thickness of the Ti absorbing layer. In the described exemplary embodiment a minimum in the air side reflectivity occurs when the Ti absorbing layer is 0.0196 μm thick.

Figure 12:
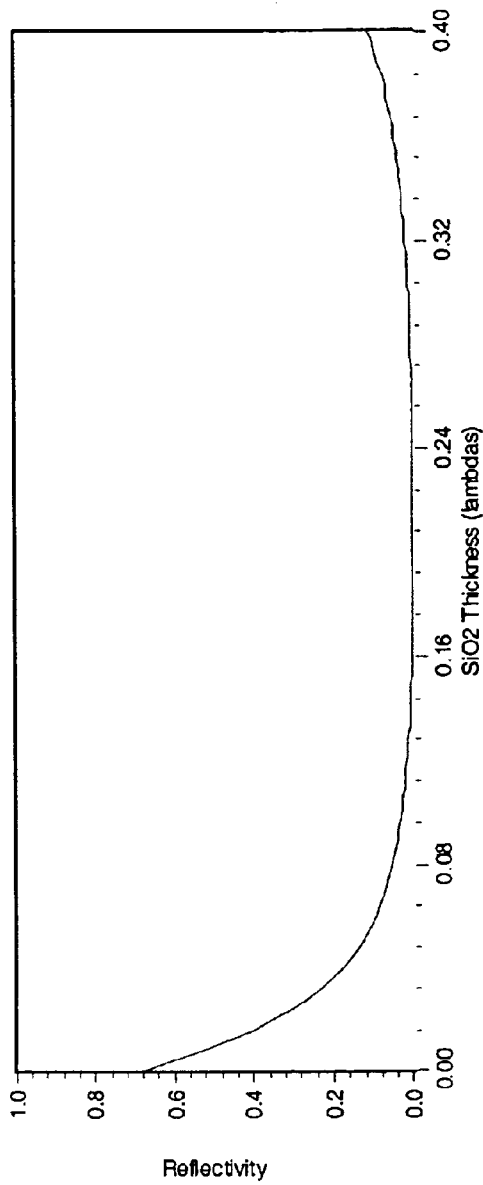
FIG. 12 is an optimization curve for the thickness of the $SiO_2$ layer with a $SiN_x$ layer thickness of 0.200λ and a Ti layer thickness of 19.6 nm in accordance with an exemplary embodiment of the present invention.

In accordance with an exemplary design process the optical thickness of the $SiO_2$ layer may now be optimized by minimizing or substantially reducing the air side reflectivity as a function of the optical thickness of the $SiO_2$ layer using the previously optimized $SiN_x$ high index and Ti absorbing layers. FIG. 12 graphically illustrates the air side reflectivity as a function of the optical thickness of the $SiO_2$ layer. In the described exemplary embodiment a minimum occurs in the air side reflectivity when the $SiO_2$ layer is approximately 0.210λ thick.

Figure 13:
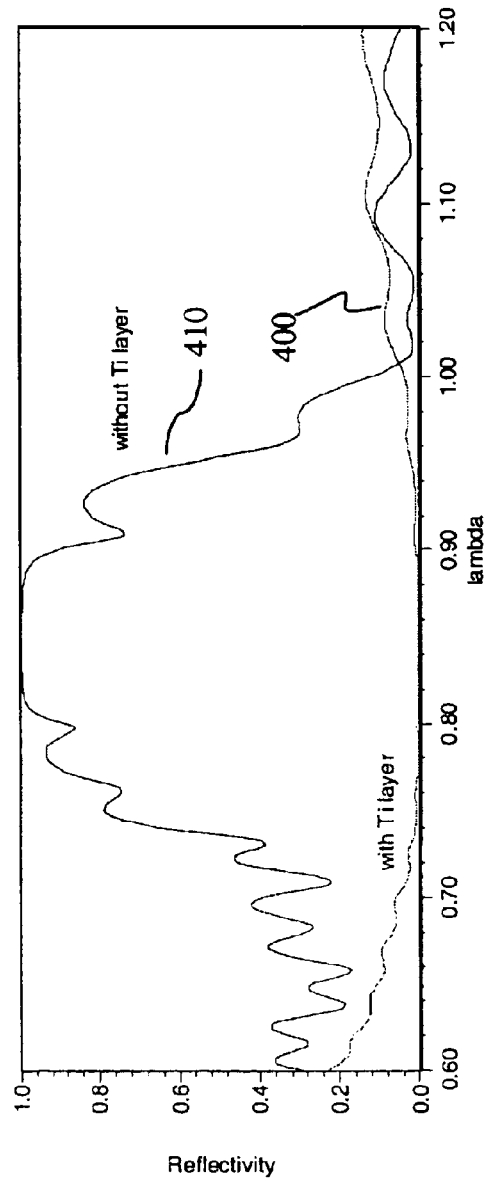
FIG. 13 graphically illustrates the air side reflectivity spectra of an optimized hybrid mirror with and without a Ti absorber in accordance with an exemplary embodiment of the present invention.

An optimized air side reflectivity spectrum may now be calculated using the optimized values for the thickness of the absorbing layer and the high and low index layers of the last mirror period. FIG. 13 graphically illustrates the air side reflectivity spectrum for a VCSEL having an emission mirror with an integrated absorbing layer 400 and without an integrated absorbing layer 410. The optimized air side reflectivity spectrum of the emission mirror having an integrated absorbing layer 400 is significantly reduced as compared to the un-optimized spectrum 290 illustrated in FIG. 8. The minimum reflectivity of the optimized structure is $R_{air}$=0.0125%.

The advantages of the present invention may be better demonstrated when the described exemplary VCSEL having an integrated absorbing layer is coupled to an external cavity. For the purposes of illustration FIG. 14 graphically illustrates the index profile 420 and standing wave pattern 430 of an external cavity formed from the emitting mirror of the described exemplary VCSEL structure with a 1λ air gap 440 and a 4% reflector 450 to provide external feedback.

Figure 15:
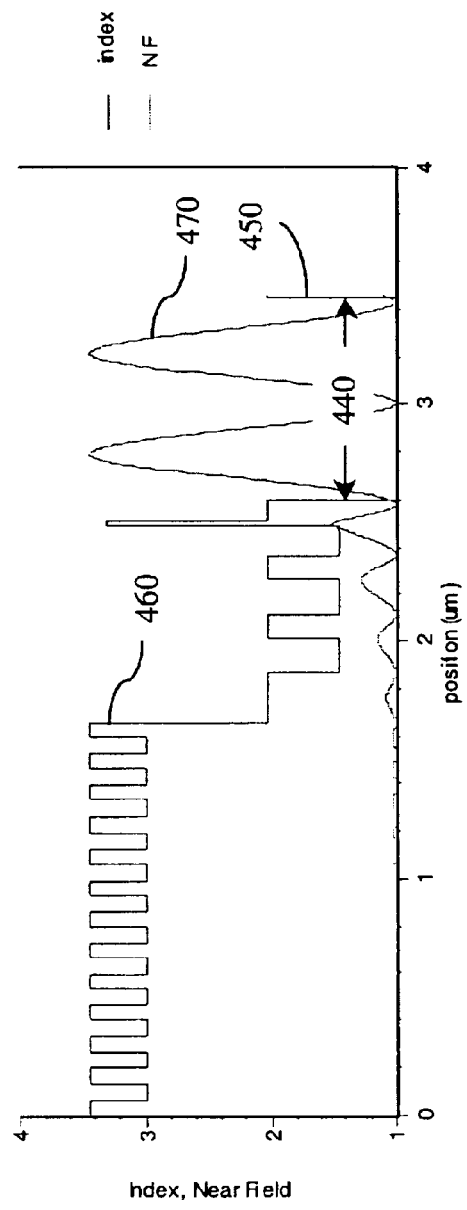
FIG. 15 is a graphical illustration of a simulation of the index profile and standing wave pattern for the VCSEL structure of FIG. 14 with an optimized Ti absorber structure substituted for the last three dielectric mirror pairs in accordance with an exemplary embodiment of the present invention.

In this example, the 4% reflector simulates typical reflections from a fiber facet. In addition, the 1λ air gap, while smaller than the cavity in a typical optical subassembly, provides a clear illustration of the standing wave structure. In practice, the air gap or external cavity may be many thousands of wavelengths thick. FIG. 15 shows the index profile 460 and standing wave pattern 470 for the same structure with an optimized Ti absorber structure substituted for the last three dielectric mirror pairs.

Figure 16:
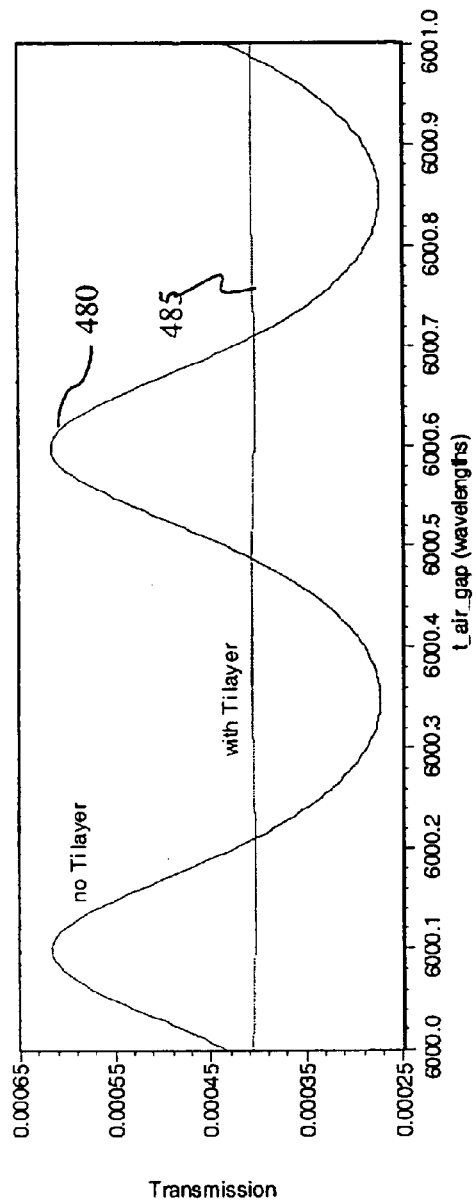
FIG. 16 is a graphical illustration of a simulation of the transmission through the external cavities of FIGS. 14 and 15 when the thickness of the air gap varies from 6000 to 6001 wavelengths in accordance with an exemplary embodiment of the present invention.

In a conventional optical sub-assembly (OSA) the external cavity may be on the order of 5 mm, which corresponds to about 6000 wavelengths. The Q, or transmissivity, of such an external cavity becomes very sensitive to the precise thickness of the air gap and/or wavelength of light that is being transmitted through it. For example, FIG. 16 is a graphical illustration of a simulation of the transmission through the external cavities of FIGS. 14 and 15 when the thickness of the cavity or air gap varies from 6000 to 6001 wavelengths.

Transmission through the external cavity 480 without an integrated absorbing layer is significantly modulated. In the illustrated embodiment, the transmission undergoes a reduction of approximately 57% from peak to valley. In this instance the entire structure may be thought of as the variable-reflectivity emitting mirror of a VCSEL. As the length of the external cavity fluctuates due to thermal expansion or contraction, the output power will be modulated by approximately the aforementioned amount. This will result in unstable light output coupled to the fiber.

However, the integration of an exemplary absorbing layer into the emitting mirror as illustrated in FIG. 15 reduces the modulation of the transmission spectra 485 as a function of the cavity size. In fact the power modulation of the described exemplary embodiment with an optimized Ti absorbing layer is reduced to approximately 0.8%.

Figure 14:
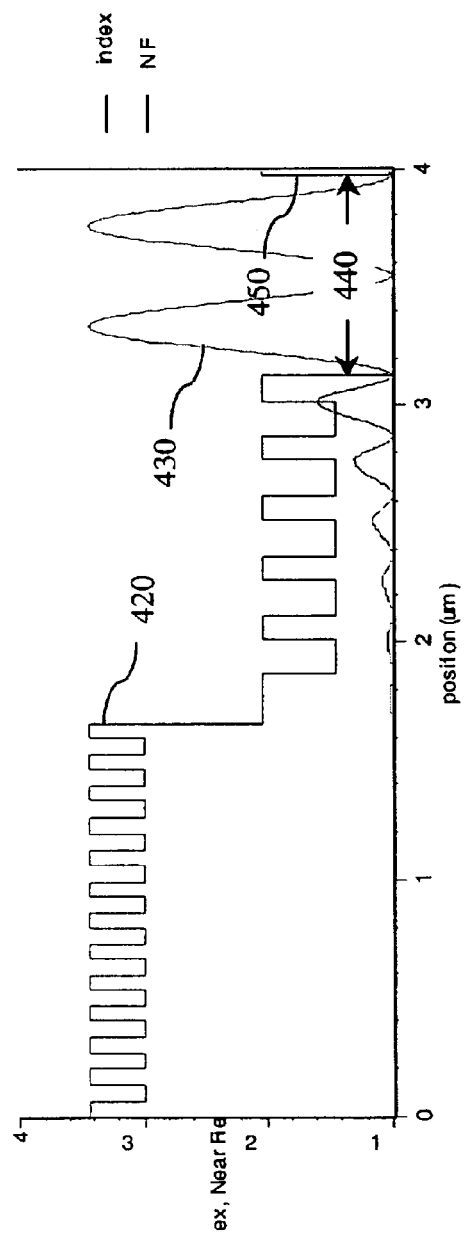
FIG. 14 is a graphical illustration of a simulation of the index profile and standing wave pattern of an external cavity formed from a VCSEL emitting mirror without an integrated absorber with a 1λ air gap and a 4% reflector that simulates the reflection from a fiber facet.
Figure 17:
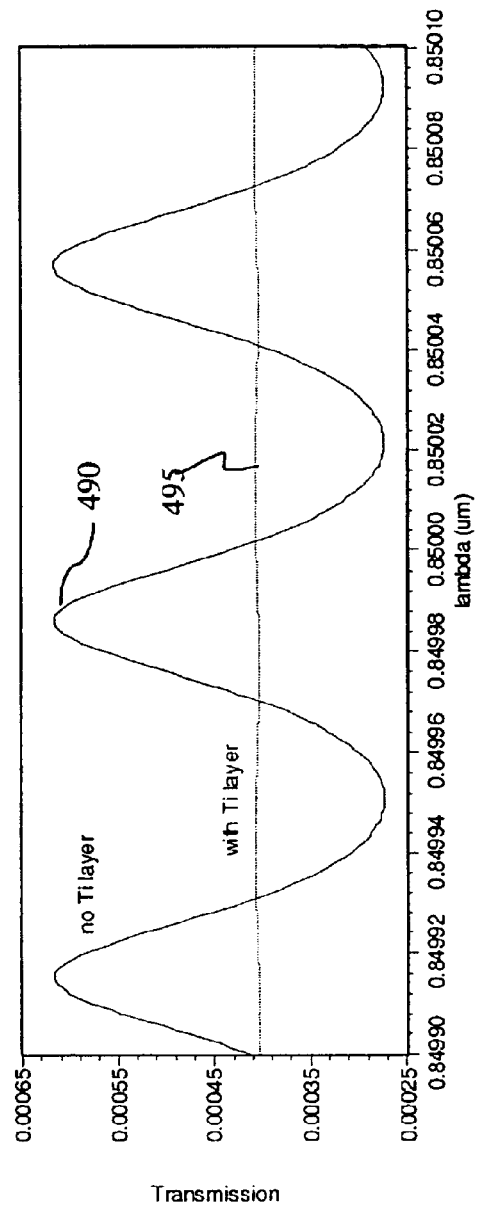
FIG. 17 is a graphical illustration of a simulation of the transmission through the external cavities FIGS. 14 and 15 when the wavelength of the transmitted light is varied slightly in accordance with an exemplary embodiment of the present invention.

Similarly, FIG. 17 is a graphical illustration of a simulation of the transmission through the external cavities of FIGS. 14 and 15 when the wavelength of the transmitted light is varied slightly. The transmission spectra 490 without an absorbing layer again experiences significant modulation with a reduction of approximately 57% from peak to valley. In operation as the bias current in the VCSEL is modulated, carrier induced index changes may cause the resonant wavelength of the VCSEL to change, resulting in output power modulation by approximately the aforementioned amount. Similarly, as the temperature in the VCSEL changes due to a change in ambient temperature or bias point, temperature induced index changes may cause the resonant wavelength of the VCSEL to change, resulting in output power modulation by approximately the aforementioned amount.

However, the integration of an exemplary absorbing layer into the emitting mirror as illustrated in FIG. 15 reduces the modulation of the transmission spectra 495 as a function of the wavelength of the emitted light. In fact the power modulation of the described exemplary embodiment with the optimized Ti absorber present is reduced to approximately 0.8%. Thus the present invention may significantly reduce the output power modulation of a laser transmitter due to coupled cavity effects.

In addition to power modulation, optical feedback in the range −35 dBm to −15 dBm may cause a significant increase in RIN. RIN degrades the signal to noise ratio of the modulated beam of the VCSEL and increases the bit error rate (BER) of a digitally modulated signal. Thus it would be beneficial if coherent external feedback could be reduced or eliminated, thus reducing RIN.

The advantages of the present invention may be further demonstrated by examining the transmission spectra of an exemplary VCSEL having an integrated absorbing layer coupled to an external cavity. For purposes of illustration the described exemplary VCSEL may be coupled to an external feedback reflector. For example, FIG. 18 graphically illustrates the index profile 500 and standing wave pattern 510 of the described exemplary VCSEL structure coupled to a 5½ pair dielectric DBR 530 via a one wavelength air gap. The one wavelength air gap is again included here to provide a clear illustration of the standing wave structure.

For the purposes of illustration FIG. 19 is a graphical illustration of a simulation of the transmission spectra of an external cavity formed when the emitting mirror of the described exemplary VCSEL structure of FIG. 18 is coupled with a 100,000λ air gap and a 5½ pair reflector to provide feedback. In this illustration the VCSEL structure does not include the internal VCSEL cavity or the lower VCSEL mirror to clearly illustrate the effects of the external cavity. In addition, an exaggerated air gap has been used so that many modes will appear n the simulated spectrum.

The transmission spectra 560 for the structure having an emitting mirror without an integrated absorber layer includes numerous resonant peaks that result from external feedback. However, the transmission spectra 580 for the structure when the emitting mirror includes an integrated absorbing layer is nearly equal to zero. The described exemplary Ti absorbing layer significantly reduces the resonances of the external cavity. A similar effect can be expected with the external cavity is coupled to a complete VCSEL structure.

In a conventional optical sub-assembly (OSA) the external cavity may be on the order of 5 mm, which corresponds to about 6000 wavelengths. The inter-modal spacing of such an external cavity is relatively small and may be calculated in accordance with equation 1 as follows:

$$\Delta\lambda=\lambda^2/2nL \tag{1}$$

Thus, for λ=850 nm, n=1 and L=5.1 mm, the inter-modal spacing Δλ is approximately equal to 0.07 nm. Typically, the stop band of a VCSEL mirror is several hundred nm wide. Therefore, many thousands of longitudinal modes of the external cavity may appear inside the stop band of the VCSEL mirror and the transmission characteristics of the VCSEL may be altered by feedback from the external cavity.

Figure 20:
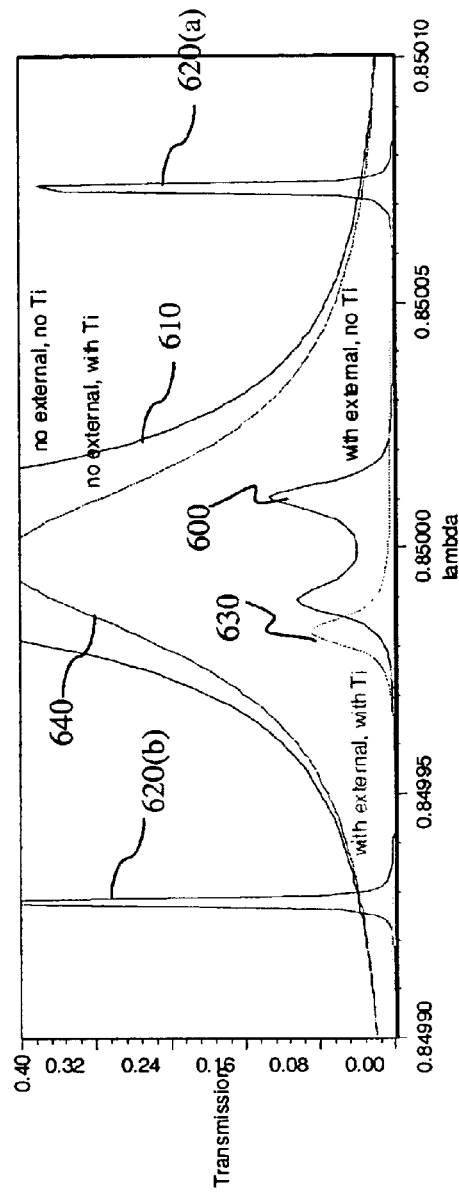
FIG. 20 is a graphical illustration of a simulation of the transmission spectra of a VCSEL with hybrid mirror, with and without Ti absorber, with and without a 6000λ external cavity with DBR mirror in accordance with an exemplary embodiment of the present invention.

For example, FIG. 20 is a simulation of the transmission spectra of an exemplary VCSEL having a hybrid upper or emission mirror, without a Ti absorbing layer integrated with a 6000λ external cavity and feedback DBR 600 and without an external cavity 610. Without the external cavity 610 there is one longitudinal mode allowed in the stop band of the mirrors. With the addition of the 6000λ external cavity 600, however, a non-uniform "comb" function with multiple transmission peaks 620(a) and 620(b) has been introduced into the transmission spectra. In addition, the original transmission peak that was evident without the external cavity has been significantly reduced.

In operation, the gain of the described exemplary device is typically broadband and relatively flat over a wide wavelength range. Therefore, a large fraction of the modes within the stopband of the mirror see essentially the same amount of gain. The competition for amplification (i.e. spectral hole burning) among these modes may cause mode hopping that may lead to relative intensity noise (RIN).

FIG. 20 also illustrates the transmission spectra of the described exemplary VCSEL with a Ti absorbing layer integrated with a 6000λ external cavity and a feedback DBR 630 and without an external cavity 640. In operation the integration of a Ti absorbing layer into the emission mirror reduces the transmission as compared to the VCSEL without an absorbing layer. More importantly however, when an external cavity is present only one resonance mode is present. Thus, the described exemplary emission mirror with an absorbing layer may substantially reduce or eliminate longitudinal mode hopping.

Figure 21:
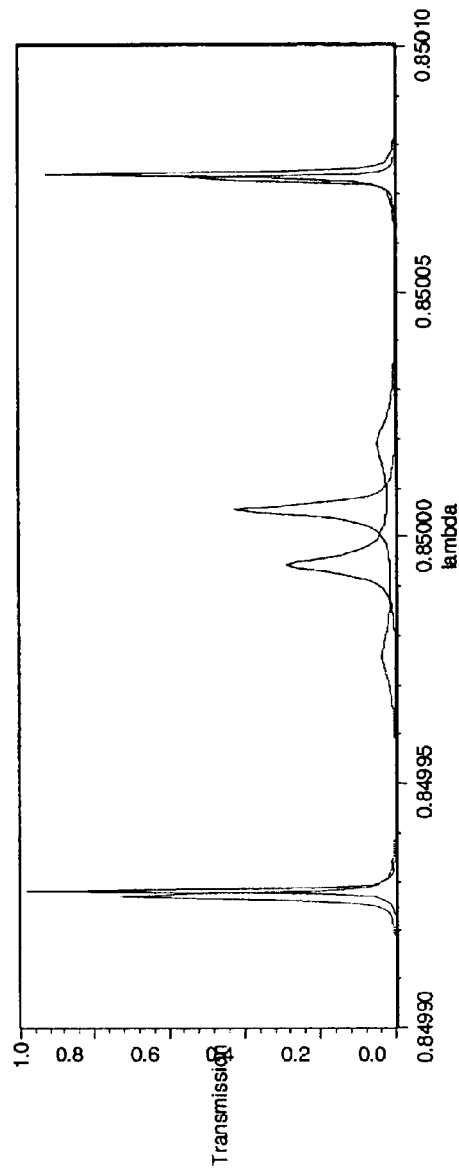
FIG. 21 is a graphical illustration of a simulation of the transmission spectra of two VCSELs each with a hybrid mirror without Ti absorber and with a 6000λ external cavity with a feedback DBR mirror, wherein there is a 0.12 nm difference in the optical thickness of the two devices.

In addition to the mode hopping that may result from gain competition and spectral hole burning, relatively small perturbations to the VCSEL cavity, such as carrier or temperature induced index fluctuations may significantly affect the transmission spectra of a VCSEL. For example, FIG. 21 is a graphical illustration of a simulation of the transmission spectra of a VCSEL without an absorbing layers and with a 6000λ external cavity and feedback DBR. The two spectra represent a VCSEL cavity optical thickness perturbation of 0.12 nm. The perturbation of the cavity alters the amplitude of the transmission spectra peaks, some of which increase, while others decrease. Such instability may contribute to longitudinal mode hopping.

Figure 22:
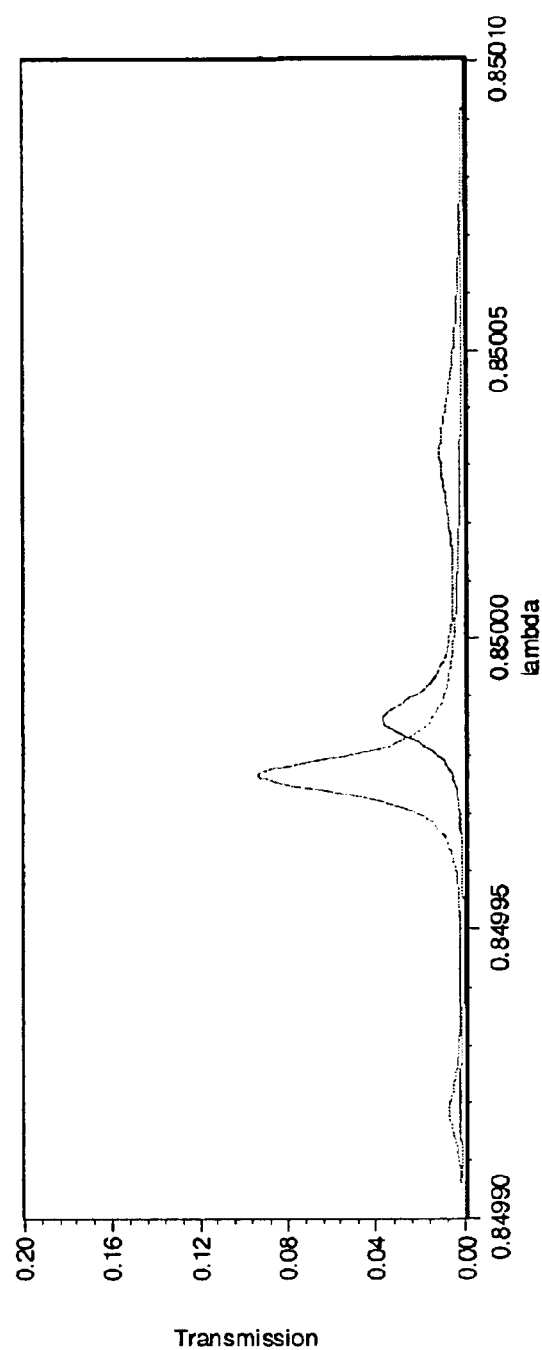
FIG. 22 is a simulation of the transmission spectra of two VCSELs each with a hybrid mirror with a Ti absorbing layer and with a 6000λ external cavity with a feedback DBR mirror, wherein there is a 0.12 nm difference in the optical thickness of the two devices in accordance with an exemplary embodiment of the present invention.

Small perturbations to the cavity of a VCSEL having an absorbing layer integrated into the emission mirror may also alter the VCSEL transmission spectra. For example, FIG. 22 is a graphical illustration of a simulation of the transmission spectra of a VCSEL with a Ti absorbing layer integrated into the emission mirror and coupled to a 6000λ external cavity and a feedback DBR mirror. The two spectra represent a 0.12 nm perturbation of the optical thickness of the VCSEL cavity. The perturbation of the cavity again alters the peak transmission. However, the laser retains a single longitudinal mode and node hopping is again avoided.

Although an exemplary embodiment of the present invention has been described, it should not be construed to limit the scope of the appended claims. Those skilled in the art will understand that various modifications may be made to the described embodiment. For example, the present invention is not limited to hybrid emitting mirrors having a semiconductor portion and a dielectric portion. Rather the present invention may be readily integrated into a dielectric or semiconductor emitting mirror.

Figure 23:
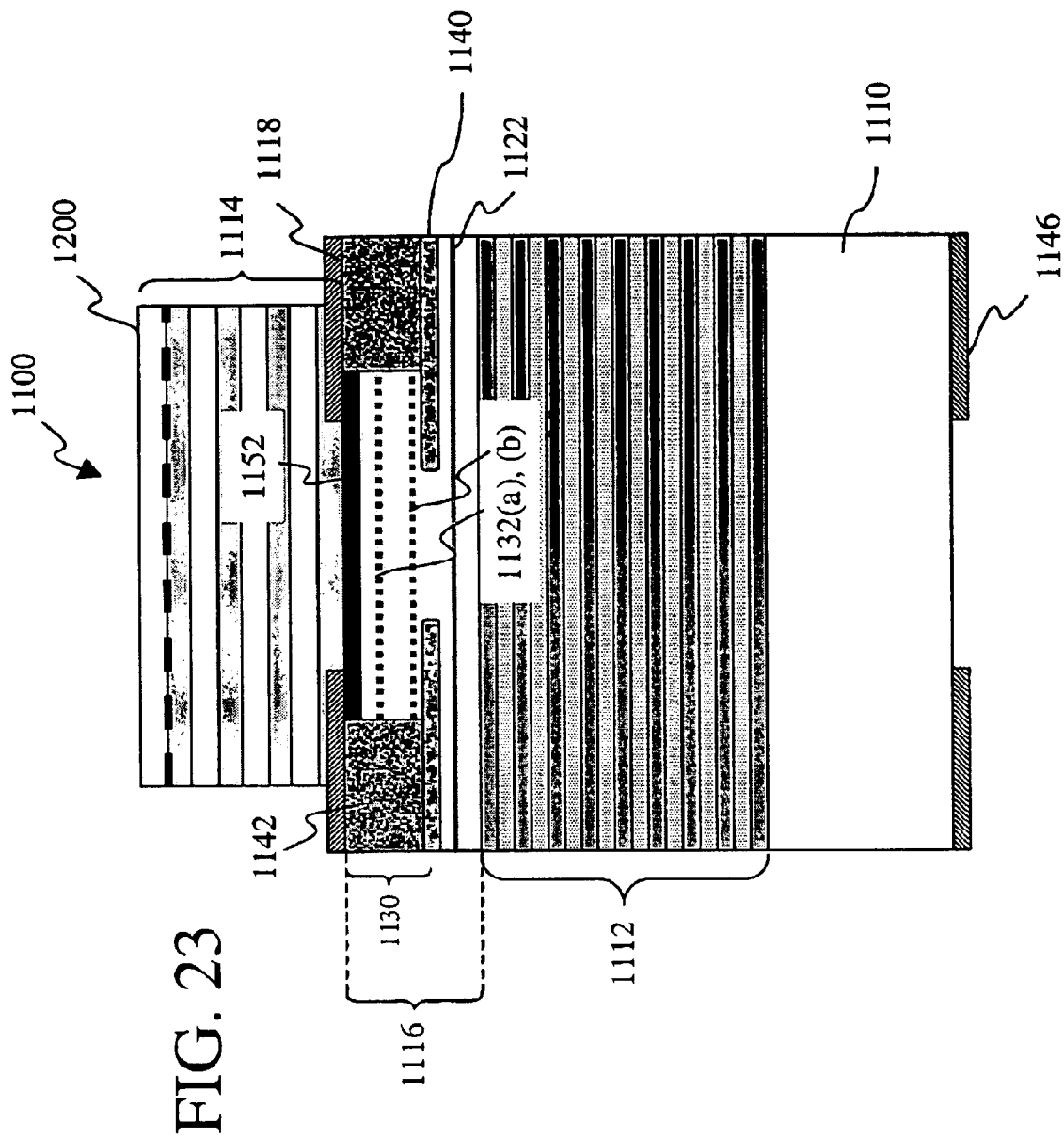
FIG. 23 is a cross-sectional view of a VCSEL having a dielectric emitting mirror with an integrated absorber layer in accordance with an exemplary embodiment of the present invention.

For example, FIG. 23 illustrates an exemplary VCSEL having a lower mirror 1112 adjacent a substrate 1110, a dielectric upper mirror 1114 above the lower mirror and an optical cavity 1116, sandwiched between the upper and lower mirrors.

The lower mirror of the VCSEL may comprise a plurality of epitaxially grown compound semiconductor mirror periods. As is known in the art, the mirror periods may comprise one-quarter wavelength thick alternating layers of a high index of refraction material and a low index of refraction material. The lower mirror of such a device may often be doped n-type with a reflectivity of at least about 99%.

In operation, electrical current is conducted through an intra-cavity contact 1118 (also referred to as an upper contact) into the optical cavity 1116 so that the upper mirror 1114 need not be conductive. Advantageously the dielectric upper mirror may reduce the series resistance and optical loss that may otherwise be associated with a semiconductor upper mirror.

In the described exemplary embodiment the compound semiconductor optical cavity 1116 may be epitaxially grown on the lower mirror 1112. The optical cavity 1116 may have an optical thickness that is an integer multiple of one-half the wavelength of the light generated within the optical cavity. The optical cavity may include an active region having, for example, one or more quantum-wells 1122 surrounded by barrier layers (not explicitly shown) as may be preferable for the formation of the VCSEL device 1100. The quantum-wells provide quantum confinement of electrons and holes therein to enhance recombination for the generation of the light, and may also include semiconductor layers comprising a plurality of quantum wires, quantum dots or other suitable gain material.

In the described exemplary embodiment the optical cavity 1116 may further comprise a delta doped upper cladding layer or contact layer 1130 for conducting holes into the active region to cause lasing. The upper cladding layer 1130 may be bulk doped with a suitable p-type dopant, such as, for example, Si or Be at a relatively low density to reduce absorption of light therein.

In one embodiment, the delta doped upper cladding layer 1130 may therefore include one or more p-type doping spikes 1132(a) and 1132(b) located at or near nulls in the optical standing wave pattern. In the described exemplary embodiment the p-type doping spikes 1132(a) and 1132(b) have a thickness equal to or less than 30 nm, and are separated by a thickness of λ/2n, where n is the index of refraction of the cladding material. Advantageously, the placement of the p-type doping spikes, at or near the standing wave nodes where the optical losses are near zero, provides lateral conduction from the intra-cavity contact with reasonable resistance, without significantly compromising the optical efficiency.

One of skill in the art will appreciate that the p-type doping spikes in the delta doped upper cladding may not be necessary in some designs where device resistance is not a limiting constraint. In addition, in an exemplary embodiment there may be a region (not specifically illustrated) of the delta doped upper cladding layer 1130 near the quantum wells that is not doped.

In accordance with an exemplary embodiment, the optical cavity may further comprise an n-type lower cladding layer (not explicitly shown) opposite the p-type upper cladding layer. In the described exemplary embodiment the lower cladding layer has no doping near the active region, but may have some continuous n-type doping closer to the lower mirror.

The intra-cavity contact 1118 (also termed upper contact) may be disposed on the topmost surface of the delta-doped optical cavity 1116 and inside a high resistance region formed by an ion implant 1142. The bottom of the substrate 1110 may include a contact metalization, forming an n-type ohmic contact 1146. In one embodiment, the n-type ohmic contact 1146 may form an annular aperture for backside monitoring of the output power. The n-type ohmic contact may be formed from AuGe/Ni/Ge or the like and may be deposited by electron beam evaporation or sputtering. The intra-cavity contact 1118 may be, for example, gold with 2% beryllium (Au/Be) added or a layered structure of titanium/platinum/gold (Ti/Pt/Au), preferably deposited by electron beam evaporation.

In the described exemplary embodiment, a contact layer 1152 may be deposited on the uppermost surface of the delta doped cladding layer 1130. In the described exemplary embodiment the contact layer is highly conductive and the intra-cavity contact 1118 may then be deposited on the more heavily doped contact layer 1152 to provide a lower resistance. In accordance with an exemplary embodiment, the contact layer may also act as a current spreading layer to provide a more uniform current distribution across the ohmic aperture, improving the uniformity of current injection into the active region of the optical cavity.

In the described exemplary embodiment the upper mirror 1114 may comprise a dielectric DBR formed from alternating one-quarter wavelength thick layers of a high index of refraction dielectric material and a low index of refraction dielectric material. For example, the upper mirror may comprise alternating layers of silicon nitride and silicon dioxide or other suitable dielectric materials. In accordance with an exemplary embodiment an absorbing layer 120C may be integrated at the low-to-high index transition ($SiO_2$/$SiN_x$ interface) in the last mirror pair. In accordance with an exemplary embodiment the thickness of the Ti layer and the optical thickness of the $SiN_x$ and $SiO_2$ layers that form the last mirror pair may again be optimized as previously described with respect to FIG. 9.

Figure 24:
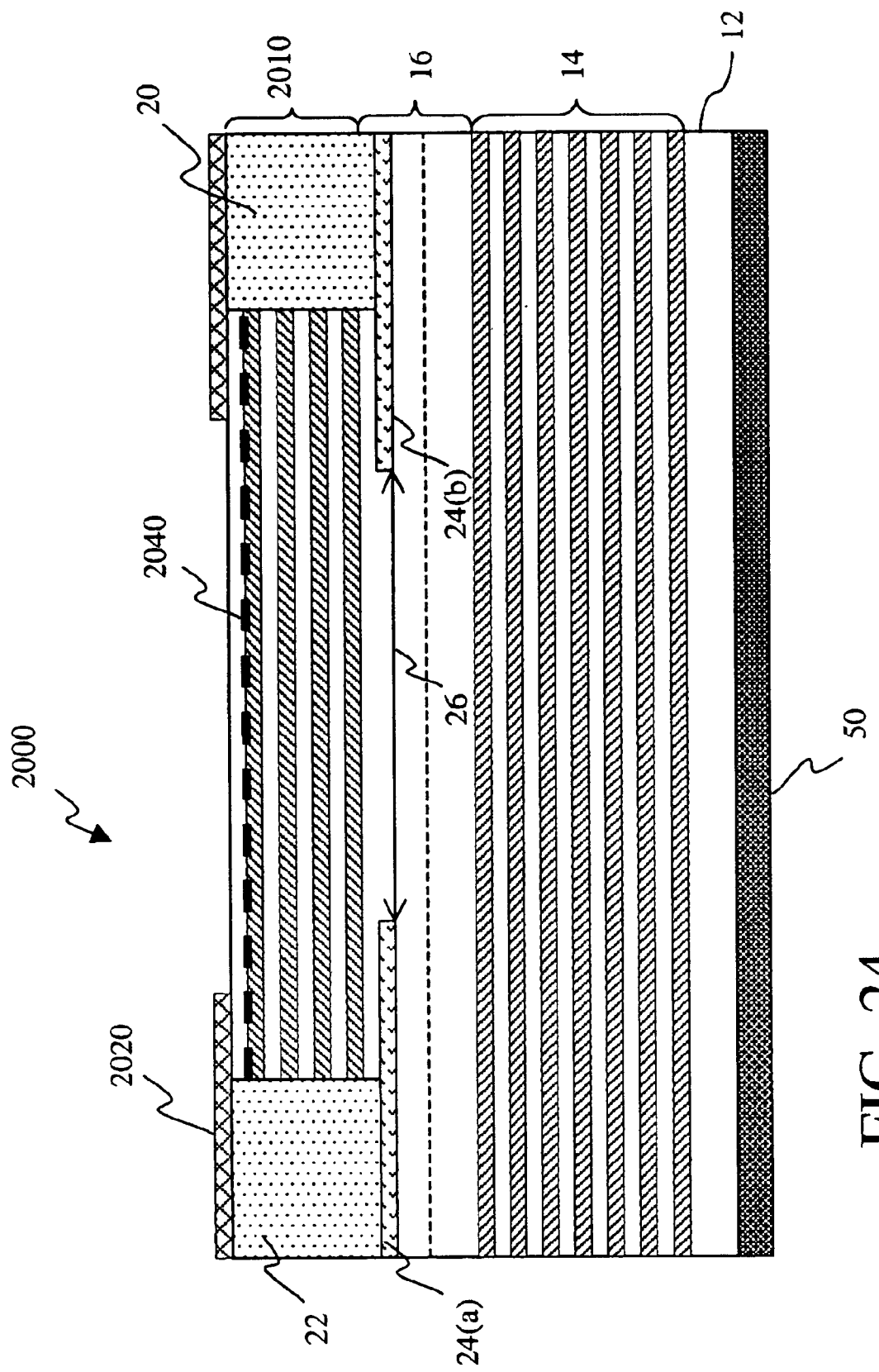
FIG. 24 is a cross-sectional view of a VCSEL having a semiconductor emitting mirror with an integrated absorber layer in accordance with an exemplary embodiment of the present invention.

One of skill in the art will appreciate that the present invention is not limited to VCSELs having a dielectric or hybrid emission mirror. Rather, an absorbing layer may also be integrated into a VCSEL 2000 having a semiconductor emission mirror as illustrated in FIG. 24 wherein like reference numbers may be used to represent like features. The VCSEL may again comprise a layered structure epitaxially-grown on a semiconductor substrate 12. An exemplary light emitting device may comprise a lower mirror 14 formed above the semiconductor substrate 12, an optical cavity 16 formed above the lower mirror stack and a second or upper mirror 2010 formed above the optical cavity.

In the described exemplary embodiment an upper ohmic contact 2020 is disposed above the optical cavity and in an exemplary embodiment may be formed on the upper mirror 2010 with an aperture inside the proton blocking aperture 22. The bottom of the substrate may again include a contact metalization, forming a lower ohmic contact 50. In one embodiment the lower ohmic contact may be an n-type ohmic contact and may be, for example, eutectic gold germanium deposited by electron beam evaporation or sputtering.

The top ohmic contact 2020 creates an ohmic aperture inside the proton blocking aperture, to provide a ring contact. In the described exemplary embodiment the top ohmic contact 2020 may be a p-type ohmic contact and may be, for example, gold with 2% beryllium added or a layered structure of titanium/platinum/gold, preferably deposited by electron beam evaporation.

In the described exemplary embodiment, the upper mirror may comprise a semiconductor mirror formed from a plurality of alternating mirror layers. In one embodiment the semiconductor mirror layers may comprise, aluminum gallium arsenide (AlGaAs) and aluminum arsenide (AlAs), with varying concentrations of aluminum for the desired emission wavelength. In an exemplary embodiment the upper and lower semiconductor mirror layers may be doped of opposite conductivity types. In the described exemplary embodiment the semiconductor mirror layers in the upper mirror may be p-type, doped with a suitable concentration of carbon or other dopants known to those skilled in the art.

In the described exemplary embodiment an absorbing layer 2040 may be integrated at the low to high index interface (i.e. standing wave null) nearest the emitting facet of the mirror. In accordance with an exemplary embodiment the absorbing layer 2040 may comprise for example, a GaAs layer in a laser emitting at a nominal wavelength of 850 nm or a highly doped p-type semiconductor layer. In accordance with an exemplary embodiment the thickness of the absorbing layer and the optical thickness of the high and low index layers that form the last mirror pair may again be optimized as previously described with respect to FIG. 9.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention.

For example, the described exemplary light emitting devices may be manufactured in the form of arrays, wherein the devices are epitaxially grown on a single substrate, processed and auto-tested as a whole wafer. Conventionally, individual devices within an array may be defined by implanting protons in the form of an annular isolation region that confines current flow within the individual VCSEL devices, while also electrically isolating each device from the other VCSEL devices in the array. However, in the case of long wavelength VCSELs the thickness of the upper mirror may exceed the maximum depth to which hydrogen or other ions may be reasonably implanted. In these instances mesas may be formed to isolate individual devices on the wafer.

The invention itself herein will further suggest solutions to other tasks and adaptations for other applications to those skilled in the art. It is therefore desired that the present embodiments be considered in all respects as illustrative and not restrictive, reference being made to the appended claims rather than the foregoing description to indicate the scope of the invention.

What is claimed is:

1. A vertical cavity surface emitting laser, comprising:
   an optical cavity adjacent a first mirror;
   an emitting mirror adjacent said optical cavity;
   a mode defining aperture for controlling transverse modes; and
   an absorbing layer integrated within the emitting mirror, wherein said absorbing layer is laterally located within at least a portion of said mode defining aperture, and
   wherein said absorbing layer is located at or near a null in the standing optical wave pattern in closest proximity to an emission facet so as to minimally interact with transmission light in the optical cavity, and further so as to strongly interact with external light reflected back into the cavity.

2. A vertical cavity surface emitting laser, comprising:

an optical cavity adjacent a firs mirror;

an emitting mirror adjacent said optical cavity;

a mode defining aperture for controlling transverse modes; and an absorbing layer integrated within the emitting mirror, wherein said absorbing layer is laterally located within at least a portion of said mode defining aperture, and wherein said absorbing layer comprises a layer of conductive material.

3. The vertical cavity surface emitting laser of claim 2 wherein said conductive material comprise, titanium.

4. The vertical cavity surface emitting laser of claim 1 wherein said absorbing layer comprises a layer of semiconductor material.

5. The vertical cavity surface emitting laser of claim 4 wherein said semiconductor material is doped p-type.

6. The vertical cavity surface emitting laser of claim 4 wherein the semiconductor material is a narrow bandgap material, and wherein an absorption edge of said semiconductor material is at a longer wavelength than emission wavelength of said vertical cavity surface emitting laser.

7. The vertical cavity surface emitting laser of claim 1 wherein said emitting mirror comprises a DBR having a plurality of mirror periods.

8. The vertical cavity surface emitting laser of claim 1 wherein said upper ohmic contact comprises an intracavity contact coupled to the optical cavity.

9. The vertical cavity surface emitting laser of claim 8 wherein said emitting mirror comprises a dielectric DBR having a plurality of mirror periods.

10. The vertical cavity surface emitting laser of claim 9 wherein optical thickness of mirror period containing said absorbing layer does not equal optical thickness of remaining mirror periods.

11. The vertical cavity surface emitting laser of claim 10 wherein said absorbing layer comprises a layer of conductive material.

12. The vertical cavity surface emitting laser of claim 11 wherein said conductive material comprises titanium.

13. The vertical cavity surface emitting laser of claim 1 wherein said emitting mirror comprises a hybrid mirror having a semiconductor portion and a dielectric portion.

14. The vertical cavity surface emitting laser of claim 13 wherein said absorbing layer is integrated within said dielectric portion.

15. The vertical cavity surface emitting laser of claim 14 wherein said absorbing layer comprises a layer of conductive material.

16. The vertical cavity surface emitting laser of claim 15 wherein said conductive material comprises titanium.

17. A vertical cavity surface emitting laser, comprising:

an optical cavity adjacent a first mirror;

a semiconductor emitting mirror adjacent said optical cavity; and an absorbing layer integrated within the emitting mirror, wherein said absorbing layer is located at or near a null in the standing optical wave pattern in closest proximity to an emission facet so as to minimally interact with transmission light in the optical cavity, and further so as to strongly interact with external light reflected back into the cavity.

18. The vertical cavity surface emitting laser of claim 17 wherein said absorbing layer comprises a layer of semiconductor material.

19. The vertical cavity surface emitting laser of claim 18 wherein said semiconductor material is doped p-type.

20. The vertical cavity surface emitting laser of claim 18 wherein the semiconductor material is a narrow bandgap material, and wherein an absorption edge of said semiconductor material is at a longer wavelength than emission wavelength of said vertical cavity surface emitting laser.

\* \* \* \* \*